United States Patent [19]

Najjar et al.

[11] Patent Number: 4,980,320

[45] Date of Patent: Dec. 25, 1990

[54] VANADIUM GARNET MATERIALS

[75] Inventors: Mitri S. Najjar, Wappingers Falls, N.Y.; Arnulf Muan, Lacey Spring, Va.

[73] Assignee: Texaco Inc., White Plains, N.Y.

[21] Appl. No.: 423,177

[22] Filed: Oct. 18, 1989

[51] Int. Cl.[5] .............................................. C30B 29/30

[52] U.S. Cl. ...................................... 501/86; 501/154; 252/301.4 R

[58] Field of Search ......................... 501/86, 133, 154; 252/301.4 R

[56] References Cited

U.S. PATENT DOCUMENTS

| | | | |
|---|---|---|---|
| 2,941,861 | 3/1955 | Wentorf, Jr. | 23/110 |
| 3,956,170 | 5/1976 | Weber | 252/301.4 R |
| 4,853,354 | 8/1989 | Cawat et al. | 501/119 |
| 4,866,016 | 9/1989 | Ando et al. | 501/153 |

FOREIGN PATENT DOCUMENTS

| | | | |
|---|---|---|---|
| 0089319 | 2/1983 | European Pat. Off. | 501/86 |
| 5141700 | 4/1976 | Japan | 501/86 |

*Primary Examiner*—William R. Dixon, Jr.
*Assistant Examiner*—Alan Wright
*Attorney, Agent, or Firm*—Robert A. Kulason; James J. O'Loughlin; Albert Brent

[57] ABSTRACT

Vanadium garnet material and a method for their preparation. The vanadium garnet material has a trivalent vanadium cation and a composition that falls within a specific polygon shaped area in a ternary composition diagram of $V_2O_3$, CaO and $SiO_2$. The polygon shaped area represents compositions of liquids with which said vanadium garnet is in equilibrium on the liquidus surface and from which the vanadium garnet phase is crystallized. A typical vanadium garnet material has the formula $Ca_3V_2Si_3O_{12}$. The vanadium garnet materials may be used in laser applications.

11 Claims, No Drawings

VANADIUM GARNET MATERIALS

BACKGROUND OF THE INVENTION

1. Field of the Invention

This invention relates to vanadium garnet materials in the $V_2O_3$—CaO—$SiO_2$ system.

2. Description of the prior art.

Phases involving the oxides of vanadium, calcium, and silicon have been synthesized previously only under the relatively oxidizing conditions of air (partial pressure of $O_2=0.2$ atmosphere). Under such conditions essentially all the vanadium is present in the pentavalent state ($V^{5+}$). Vanadium garnet crystals are not stable under such conditions. The liquidus and solidus temperatures of such materials are relatively low (less than 690° C. for some mixtures). In comparison, the liquidus and solidus temperatures for the subject solid solutions involving $V_2O_3$—CaO—$SiO_2$ is at least 1100° C.

SUMMARY OF THE INVENTION

The present invention pertains to novel vanadium garnet materials and a method for their preparation. The material comprises vanadium garnet containing vanadium in the trivalent state. For example, point K in the drawing corresponds to the formula $Ca_3V_2Si_3O_{12}$ and falls within a polygon in a ternary composition diagram of $V_2O_3$, CaO and $SiO_2$. The material falling within said polygon represents compositions of liquids within the ternary system CaO—$V_2O_3$—$SiO_2$ with which said garnet phase is in equilibrium on the liquidus surface and from which the garnet phase is crystallized. The polygon shaped shaded area has the vertices and corresponding coordinates in weight percent as shown in Table I.

TABLE I

| Vertices | Coordinates (wt %) | | |
|---|---|---|---|
| | $V_2O_3$ | CaO | $SiO_2$ |
| A | 26.5 | 27.5 | 46.0 |
| B | 23.7 | 32.5 | 43.8 |
| C | 17.2 | 43.8 | 39.0 |
| D | 17.0 | 45.0 | 38.0 |
| E | 26.2 | 43.8 | 30.0 |
| F | 21.3 | 46.7 | 25.0 |
| G | 31.0 | 50.0 | 19.0 |
| H | 46.2 | 41.3 | 12.5 |
| I | 47.50 | 38.8 | 13.7 |
| J | 40.00 | 32.5 | 27.5 |

A method of preparing a vanadium garnet material involving $V_2O_3$, CaO and $SiO_2$ from a liquid with which said vanadium garnet is in equilibrium on the liquidus surface and said liquid has a composition that falls within a polygon shaped area in a ternary composition diagram of $V_2O_3$, CaO and $SiO_2$ comprises the steps of:

(1) heating $V_2O_5$ powder having a particle size of less than about 50 microns in an atmosphere in which the partial pressure of oxygen is in the range of $10^{-5}$ to $10^{-10}$ atmosphere and the $CO_2/H_2$ volume ratio is in the range of about 10/1 to 1/1 while gradually increasing the temperature stepwise over a temperature range of about 600° C. to 1300° C. and holding the final temperature for a period of at least about 24 hrs. to ensure complete reduction of all vanadium to $V^{3+}$;

(2) heating CaO and $SiO_2$ powders each having a particle size of less than about 50 microns for a period of about 10 to 14 hrs. at a temperature in the range of about 1000° C. to 1200° C.;

(3) thoroughly grinding together an amount of $V_2O_3$ from (1) in the range of about 17 to 47.5 wt. %, with an amount of CaO from (2) in the range of about 27.5 to 50 wt. %, and an amount of $SiO_2$ from (2) in the range of about 12.5 to 46 wt. % to produce a mixture having a grain size of less than about 50 microns, (4) pelletizing the mixture from (3) at a pressure of about 5,000 psi; and (5) heating the pellets from (4) at a temperature in the range of about 1100° C. to 1400° C. for a period in the range of about 12 to 48 hrs. in an atmosphere in which the partial pressure of oxygen is in the range of $10^{-10}$ to $10^{-5}$ atmosphere to produce said solid vanadium garnet material.

BRIEF DESCRIPTION OF THE DRAWING

The drawing depicts a ternary composition diagram of $V_2O_3$CaOand$SiO_2$ showing a polygon shaped shaded area representing liquid compositions which are in equilibrium with vanadium garnet material on the liquidus surface and from which vanadium garnet phase is crystallized.

DESCRIPTION OF THE INVENTION

New vanadium garnet materials have been synthesized by the subject invention in which garnet material involving trivalent vanadium cation as a component have been characterized. This work has led to synthesizing new garnet phases in which trivalent vanadium cations are accommodated such as to render crystalline phases thermodynamically stable over a wide range of oxygen pressures at elevated temperatures.

The newly synthesized vanadium garnet materials have a compositions that fall with a polygon shaped shaded area in the ternary composition diagram in the drawing, wherein the polygon shaped shaded area represents compositions of liquids with which said vanadium garnet is in equilibrium on the liquidus surface and from which said garnet phase is crystallized. The oxidation state of vanadium in the garnet material is mainly +3.

The polygon shaped shaded area has the following vertices and corresponding coordinates in weight percent:

| Vertices | Coordinates (wt %) | | |
|---|---|---|---|
| | $V_2O_3$ | CaO | $SiO_2$ |
| A | 26.5 | 27.5 | 46.0 |
| B | 23.7 | 32.5 | 43.8 |
| C | 17.2 | 43.8 | 39.0 |
| D | 17.0 | 45.0 | 38.0 |
| E | 26.2 | 43.8 | 30.0 |
| F | 21.3 | 46.7 | 25.0 |
| G | 31.0 | 50.0 | 19.0 |
| H | 46.2 | 41.8 | 12.5 |
| I | 47.50 | 38.8 | 13.7 |
| J | 40.00 | 32.5 | 27.5 |

A typical newly synthesized vanadium garnet material having the formula $Ca_3V_2Si_3O_{12}$ is illustrated by point K in the drawing having the following coordinates in wt. %: $V_2O_3$ 31.9, CaO 35.8, and $SiO_2$ 32.3. This phase is relatively easy to synthesize. It appears as beautiful euhedral crystals in equilibrium with liquids.

It is to be noted that the vanadium garnet appears as a primary phase on the liquidus surface of the system, $V_2O_3$—CaO—$SiO_2$. Accordingly, the growing of single crystals of this material is relatively simple, provided that atmospheric control of the type used in the synthesis procedure described herein is maintained during the crystal growing process.

Ternary compounds in the $V_2O_3$—CaO—$SiO_2$ system are synthesized in the following manner: First, $V_2O_3$ is prepared by heating commercially available analytical-grade $V_2O_5$ having a particle size of less than about 50 microns in a vertical tube furnace in an atmosphere of carefully selected oxygen pressure within the stability range of $V_2O_3$ e.g. in the range of $10^{-5}$ to $10^{-10}$ atmospheres. This is accomplished by using a gas mixture of high-purity $CO_2$ and $H_2$ in controlled proportions. The $CO_2/H_2$ ratio by volume is in the range of 10/1 to 1/1. The relatively low melting point of the starting vanadium oxide ($V_2O_5$), e.g. about 690° C., necessitates heating the oxide slowly. Starting at a temperature of about 600° C., the temperature is gradually increased stepwise over a period of about 12 to 24 hrs. to a final temperature of about 1300° C. At that final temperature the vanadium oxide is held at least about 24 hrs. e.g. 24 to 30 hrs. to ensure complete reduction of all vanadium to $V^{+3}$($V_2O_3$).

Pre-heated analytical-grade oxides having a particle size of less than about 50 microns are used as starting materials for the other components of the garnet phase to be synthesized. For example, CaO and $SiO_2$ are heated for about 10 to 14 hrs. at a temperature in the range of about 1000° C. to 1200° C. prior to being used in preparation of the final mixtures.

The mixtures of the three oxide components are mechanically ground together under acetone in an agate mortar to ensure thorough mixing and a sufficiently small grain size e.g. less than 50 microns. For example, a specific amount of $V_2O_3$ in the range of about 17 to 47.5 wt. % is ground together with a specific amount of CaO in the range of about 27.5 to 50 wt. %, and a specific amount of $SiO_2$ in the range of about 12.5 to 46 wt. % to produce a mixture having a grain size of less than about 50 microns. Complete formation of the desired compounds in the heat treatment step is thereby promoted. The oxide mixtures are pelletized at a pressure of about 5,000 psi or higher. The pellets may have any conventional size e.g. 1/16" to 1". The pellets are then heated at a temperature in the range of about 1100° C. to 1400° C. for a period in the range of about 12 to 48 hrs. in a vertical tube furnace with carefully controlled oxygen pressures, and in the range of $10^{-10}$ to $10^{-5}$ atmosphere. In the manner described previously for preparing $V_2O_3$, the pellets are heated in a furnace atmosphere provided by a gas mixture of $CO_2$ and $H_2$ in various desired mixing ratios, typically in the range of about 10/1 to 1/1. These selected ratios are kept constant for the duration of the synthesis by use of a differential manometer. By this method the oxygen pressure at the specified temperature can be controlled to better than ±1%. The thermodynamic data for the water-gas reaction ($CO_2+H_2=CO+H_2O$), on which the calculations were based, are known with extremely high accuracy (better than 0.1%); and hence the method used ensures reliable accurate control of the oxidation state of vanadium during the synthesis. This is extremely important for optimization of the properties of the finished product.

The vanadium garnet materials involving $V_2O_3$—CaO—$SiO_2$ may be used in laser applications, offering greater stability over a wider temperature range e.g. about 1000° C. or higher than that which is offered by typical laser materials.

Various modifications of the invention as herein before set forth may be made without departing from the spirit and scope thereof, and therefore, only such limitations should be made as are indicated in the appended claims.

We claim:

1. A vanadium garnet composition involving $V_2O_3$, CaO and $SiO_2$ wherein the shaded area circumscribed by ABCDEFGHIJ as shown in the disclosed FIGURE for a ternary composition diagram of $V_2O_3$, CaO and $SiO_2$ represents compositions of liquids with which said vanadium garnet is in equilibrium on the liquidus surface and from which said vanadium garnet phase is crystallized, and wherein the amounts of $V_2O_3$, CaO and $SiO_2$ are characterized as shown in the table below:

| Vertices | Coordinates (wt %) | | |
|---|---|---|---|
| | $V_2O_3$ | CaO | $SiO_2$ |
| A | 26.5 | 27.5 | 46.0 |
| B | 23.7 | 32.5 | 43.8 |
| C | 17.2 | 43.8 | 39.0 |
| D | 17.0 | 45.0 | 38.0 |
| E | 26.2 | 43.8 | 30.0 |
| F | 21.3 | 46.7 | 25.0 |
| G | 31.0 | 50.0 | 19.0 |
| H | 46.2 | 41.8 | 12.5 |
| I | 47.5 | 38.8 | 13.7 |
| J | 40.0 | 32.5 | 27.5. |

2. A vanadium garnet material as provided in claim 1 having the formula $Ca_3V_2Si_3O_{12}$ as illustrated by point K in the composition diagram in (a) and having the following coordinates in wt. %: $V_2O_3$ 31.9, CaO 35.8 and $SiO_2$ 32.3.

3. A vanadium garnet material as provided in claim 1 wherein said vanadium is present in the trivalent state.

4. A method of preparing a vanadium garnet material involving $V_2O_3$, CaO and $SiO_2$ from a liquid with which said vanadium garnet is in equilibrium on the liquidus surface and wherein said liquid has a composition that falls within a polygon shaped shaded area ABCDEFGHIJ as shown in the disclosed FIGURE for a ternary composition diagram of $V_2O_3$, CaO and $SiO_2$ comprising the steps of:

(1) heating $V_2O_5$ powder having a particle size of less than about 50 microns in an atmosphere in which the partial pressure of oxygen is in the range of $10^{-5}$ to $10^{-10}$ atmospheres while gradually increasing the temperature over a temperature range of about 600° C. to 1300° C. and holding the final temperature for a period to ensure complete reduction of all vanadium to $V^{3+}$;

(2) heating CaO and $SiO_2$ powders each having a particle size of less than about 50 microns for a period of about 10 to 14 hrs at a temperature in the range of about 1000° C. to (3) thoroughly grinding together an amount of $V_2O_3$ from (1) in the range of about 17 to 47.5 wt. %, with an amount of CaO from (2) in the range of about 27.5 to 50 wt. %, and an amount of $SiO_2$ from (2) in the range of about 12.5 to 46 Wt. % to produce a mixture having a grain size of less than about 50 microns, (4) pelletizing the mixture from (3) at a pressure of about 5,000 psi; and (5) heating the pellets from (4) at a temperature in the range of about 1100° C. to 1400° C. for a period in the range of about 12 to 48 hrs in an atmosphere in which the partial pressure of oxygen is in the range of $10^{-10}$ to $10^{-5}$ atmosphere, and crystallizing out said vanadium garnet phase.

5. The method of claim 4 wherein said polygon shaped shaded area has the following vertices and corresponding coordinates in weight percent:

| | Coordinates (wt %) | | |
|---|---|---|---|
| Vertices | $V_2O_3$ | CaO | $SiO_2$ |
| A | 26.5 | 27.5 | 46.0 |
| B | 23.7 | 32.5 | 43.8 |
| C | 17.2 | 43.8 | 39.0 |
| D | 17.0 | 45.0 | 38.0 |
| E | 26.2 | 43.8 | 30.0 |
| F | 21.3 | 46.7 | 25.0 |
| G | 31.0 | 50.0 | 19.0 |
| H | 46.2 | 41.8 | 12.5 |
| I | 47.50 | 38.8 | 13.7 |
| J | 40.00 | 32.5 | 27.5. |

6. The process of claim 4 where in (1) said $V_2O_5$ powder is heated over a period of about 12 to 24 hours from a temperature of about 600° C. to a final temperature of 1300° C.; and the final temperature of the vanadium oxide is held at least 24 hours.

7. The method of claim 4 where in (1) said $V_2O_5$ powder is heated in an atmosphere comprising a gas mixture of high purity $CO_2$ and $H_2$ with a volume ratio of $CO_2/H_2$ in the range of about 10/1 to 1/1.

8. The method of claim 4 where in step (5) said pellets are heated in an atmosphere comprising a gas mixture of high purity $CO_2$ and $H_2$ with a volume ratio of $CO_2/H_2$ in the range of about 10/1 to 1/1.

9. The method of claim 5 wherein said vanadium garnet material has the formula $Ca_3V_2Si_3O_{12}$ as illustrated by point K in the composition diagram in (a) and has the following coordinates in wt. %: $V_2O_3$ 31.9, CaO 35.8 and $SiO_2$ 32.3.

10. The method of claim 8 wherein said vanadium garnet material is a laser material.

11. A laser material involving $V_2O_3$, CaO and $SiO_2$, wherein the shaded area circumscribed by ABCDEFGHIJ as shown in the disclosed FIGURE represents compositions of liquids with which said laser material is in equilibrium on the liquidus surface and from which said laser material is crystallized, and wherein the amounts of $V_2O_3$, CaO and $SiO_2$ are characterized as shown in the table below:

| | Coordinates (wt %) | | |
|---|---|---|---|
| Vertices | $V_2O_3$ | CaO | $SiO_2$ |
| A | 26.5 | 27.5 | 46.0 |
| B | 23.7 | 32.5 | 43.8 |
| C | 17.2 | 43.8 | 39.0 |
| D | 17.0 | 45.0 | 38.0 |
| E | 26.2 | 43.8 | 30.0 |
| F | 21.3 | 46.7 | 25.0 |
| G | 31.0 | 50.0 | 19.0 |
| H | 46.2 | 41.8 | 12.5 |
| I | 47.50 | 38.8 | 13.7 |
| J | 40.00 | 32.5 | 27.5. |

* * * * *

UNITED STATES PATENT AND TRADEMARK OFFICE

CERTIFICATE OF CORRECTION

PATENT NO. : 4,980,320

DATED : Dec. 25, 1990

INVENTOR(S) : Mitri S. Najjar and Arnulf Muan

It is certified that error appears in the above-identified patent and that said Letters Patent is hereby corrected as shown below:

The title page should be deleted to appear as per attached title page.

The Drawing Sheet should be inserted as per attached sheet.

Column 2, line 20, after "$V_2O_3$" insert --,--

Column 4, line 59, after "to" insert --1200°C.--

Signed and Sealed this

Seventeenth Day of November, 1992

Attest:

DOUGLAS B. COMER

*Attesting Officer*

*Acting Commissioner of Patents and Trademarks*

United States Patent [19]

Najjar et al.

[11] Patent Number: 4,980,320

[45] Date of Patent: Dec. 25, 1990

[54] VANADIUM GARNET MATERIALS

[75] Inventors: Mitri S. Najjar, Wappingers Falls, N.Y.; Arnulf Muan, Lacey Spring, Va.

[73] Assignee: Texaco Inc., White Plains, N.Y.

[21] Appl. No.: 423,177

[22] Filed: Oct. 18, 1989

[51] Int. Cl.[5] .................... C30B 29/30

[52] U.S. Cl. .................... 501/86; 501/154; 252/301.4 R

[58] Field of Search .................... 501/86, 133, 154; 252/301.4 R

[56] References Cited

U.S. PATENT DOCUMENTS

| | | | |
|---|---|---|---|
| 2,941,861 | 3/1955 | Wentorf, Jr. | 23/110 |
| 3,956,170 | 5/1976 | Weber | 252/301.4 R |
| 4,853,354 | 8/1989 | Cawat et al. | 501/119 |
| 4,866,016 | 9/1989 | Ando et al. | 501/153 |

FOREIGN PATENT DOCUMENTS

| | | | |
|---|---|---|---|
| 0089319 | 2/1983 | European Pat. Off. | 501/86 |
| 5141700 | 4/1976 | Japan | 501/86 |

*Primary Examiner*—William R. Dixon, Jr.
*Assistant Examiner*—Alan Wright
*Attorney, Agent, or Firm*—Robert A. Kulason; James J. O'Loughlin; Albert Brent

[57] ABSTRACT

Vanadium garnet material and a method for their preparation. The vanadium garnet material has a trivalent vanadium cation and a composition that falls within a specific polygon shaped area in a ternary composition diagram of $V_2O_3$, CaO and $SiO_2$. The polygon shaped area represents compositions of liquids with which said vanadium garnet is in equilibrium on the liquidus surface and from which the vanadium garnet phase is crystallized. A typical vanadium garnet material has the formula $Ca_3V_2Si_3O_{12}$. The vanadium garnet materials may be used in laser applications.

11 Claims, 1 Drawing Sheet

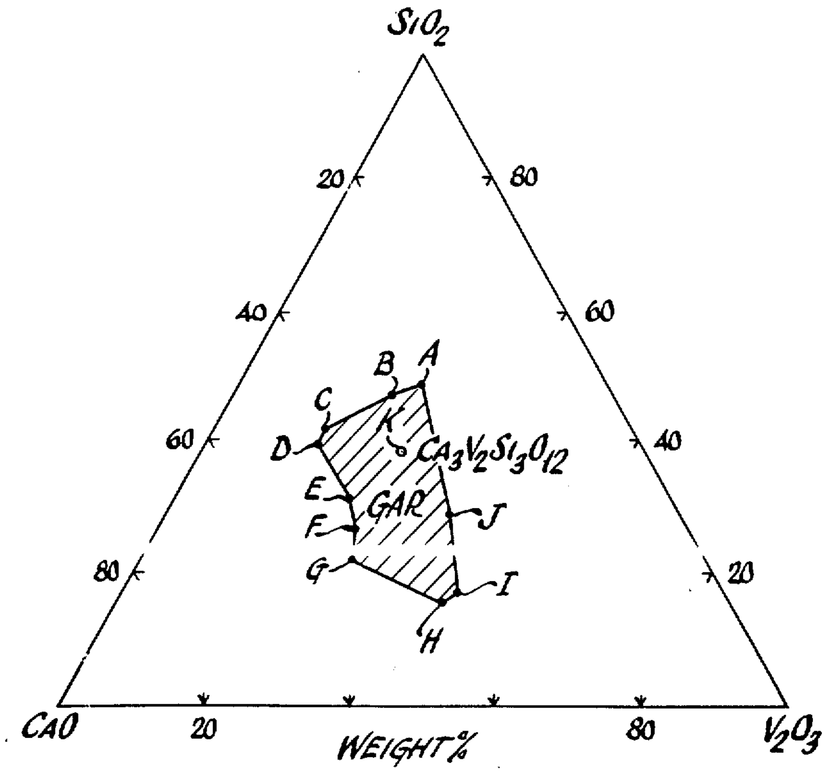

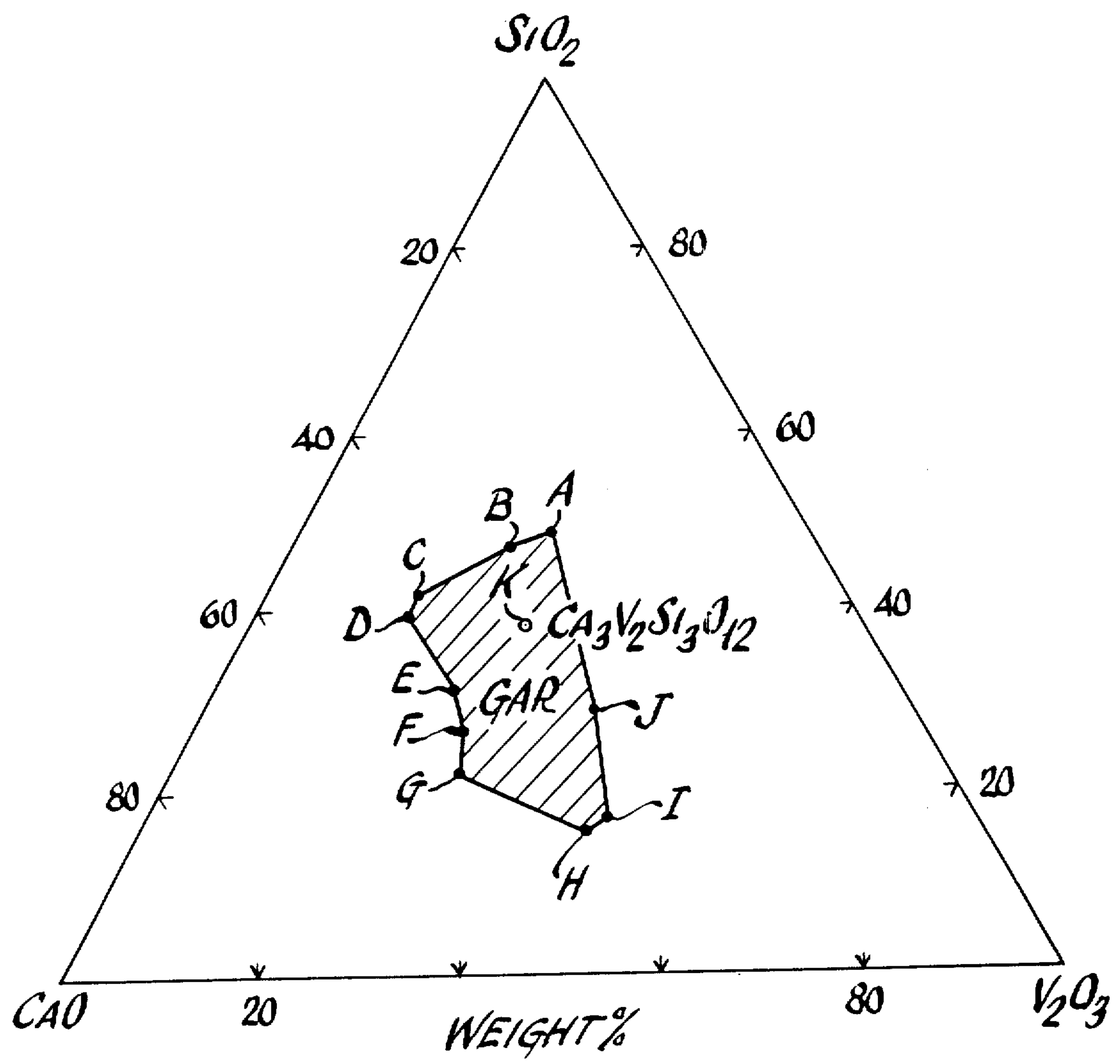
SiO2
20
40
60
80
80
60
40
20
CAO
20
80
V2O3
WEIGHT%
A
B
C
D
E
F
G
H
I
J
K
CA3V2SI3O12
GAR